(12) United States Patent
Hiner et al.

(10) Patent No.: US 6,747,301 B1
(45) Date of Patent: Jun. 8, 2004

(54) SPIN DEPENDENT TUNNELING BARRIERS FORMED WITH A MAGNETIC ALLOY

(75) Inventors: Hugh Craig Hiner, Fremont, CA (US); Kyusik Sin, Pleasanton, CA (US); Shin Funada, Pleasanton, CA (US); Xizeng Shi, Fremont, CA (US); Hua-Ching Tong, San Jose, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 122 days.

(21) Appl. No.: 10/071,798

(22) Filed: Feb. 6, 2002

(51) Int. Cl.$^7$ ............................................. H01L 29/76
(52) U.S. Cl. ..................... 257/295; 365/105; 365/154; 365/158; 365/171; 365/173; 365/175; 360/314
(58) Field of Search ................................ 365/108, 154, 365/158, 171, 173, 175; 360/314

(56) References Cited

U.S. PATENT DOCUMENTS

| | | | |
|---|---|---|---|
| 5,835,314 A | 11/1998 | Moodera et al. | 360/113 |
| 6,205,008 B1 | 3/2001 | Gijs et al. | 360/324 |
| 6,205,052 B1 | 3/2001 | Slaughter et al. | 365/173 |
| 6,261,646 B1 | 7/2001 | Chen et al. | 427/531 |
| 6,275,363 B1 | 8/2001 | Gill | 360/324.2 |
| 6,281,538 B1 | 8/2001 | Slaughter | 257/295 |
| 6,295,225 B1 | 9/2001 | Oepts | 365/171 |
| 6,473,275 B1 * | 10/2002 | Gill | 360/314 |
| 6,515,895 B2 * | 2/2003 | Naji | 365/171 |
| 6,522,573 B2 * | 2/2003 | Saito et al. | 365/158 |

OTHER PUBLICATIONS

Handbook of Ternary Alloy Phase Diagrams article containing diagrams of Al–Fe–Si and Al–Fe–Si, p. 3606.
Handbook of Ternary Alloy Phase Diagrams article containing diagrams of Al–Co–Si and Al–Co–Sm, p. 3068.
Binary Alloy Phase Diagrams article entitled "Al–Co (Aluminum–Cobalt)", by A. J. McAlister, pp. 136–138.
Binary Alloy Phase Diagrams article entitled "Al–Eu (Aluminum–Europium)", by Editor, and "Al–Fe (Aluminum–Iron)", by U. R. Kattner, pp. 147–149.
IEEE Transactions on Magnetics article entitled "Effect of Bias Voltage and Interdiffusion in Ir–Mn Exchanger–Biased Double Tunnel Junction", by Y. Saito et al., vol. 37, No. 4, Jul. 2001, pp. 1979–1982, copyright 2001.
IEEE Transactions on Magnetics article entitled "Spin Dependent Tunnel Junctions for Memory and Read–Head Applications", by P. Freitas et al., vol. 36, No. 5, Sep. 2000, pp. 2796–2801, copyright 2000.

\* cited by examiner

*Primary Examiner*—David Nelms
*Assistant Examiner*—Mai-Huong Tran
(74) *Attorney, Agent, or Firm*—Mark Lauer

(57) ABSTRACT

A tunneling barrier for a spin dependent tunneling (SDT) device is disclosed that includes a plurality of ferromagnetic atoms disposed in a substantially homogenous layer. The presence of such atoms in the tunneling barrier is believed to increase a magnetoresistance or ΔR/R response, improving the signal and the signal to noise ratio. Such an increase ΔR/R response also offers the possibility of decreasing an area of the tunnel barrier layer. Decreasing the area of the tunnel barrier layer can afford improvements in resolution of devices such as MR sensors and increased density of devices such as of MRAM cells.

37 Claims, 4 Drawing Sheets

SPIN DEPENDENT TUNNELING BARRIERS FORMED WITH A MAGNETIC ALLOY

TECHNICAL FIELD

The present application relates to spin-dependent tunneling (SDT) devices. Such devices may be employed in many applications, including information storage and retrieval devices (e.g., electromagnetic transducers), solid-state memory for computers and digital processing systems (e.g., MRAM) and measurement and testing systems (e.g., magnetic field sensors).

BACKGROUND

Spin-dependent tunneling (SDT) effects are believed to depend upon a quantum mechanical probability of electron tunneling from one ferromagnetic (FM) electrode to another through a thin, electrically nonconductive layer, with the probability of tunneling depending upon the direction of magnetization of one electrode versus the other. SDT effects have many potential applications in magnetic field sensing devices, such as magnetic field sensors and information storage and retrieval devices. Read transducers for magnetic heads used in disk or tape drives, which may be termed magnetoresistive (MR) sensors, and solid-state memory devices such as magnetic random access memory (MRAM), are potential commercial applications for spin tunneling effects.

Elements of SDT devices include two FM electrodes and an electrically insulating tunneling barrier. One of the electrodes may include a pinned ferromagnetic layer and the other may include a free ferromagnetic layer. The pinned layer typically consists of a FM layer that has its magnetic moment stabilized by a pinning structure. The pinning structure may be an antiferromagnetic (AFM) layer that adjoins the pinned layer. The magnetic stabilization of the pinned layer may also be accomplished with a synthetic AFM structure that includes a transition metal such as ruthenium (Ru) in a sandwich between two FM layers, in which the transition metal layer has a precisely defined thickness that is typically less than 10 Å. The magnetization direction of the pinned FM layer is set upon deposition and annealing in a magnetic field. The free layer is typically a magnetically soft FM layer.

The free layer is designed to be magnetically decoupled from the pinned layer, so that the pinned layer does not hinder the response of the free layer to a magnetic field signal that is to be detected. The nonmagnetic tunneling barrier provides the magnetic decoupling between the pinned and free layers. The tunneling barrier is made of a thin dielectric layer, such as $Al_2O_3$ or AlN, which has a thickness typically in a range between 0.5 nm and 2 nm.

The tunnel barrier layer is designed to be a uniform and pinhole free dielectric film at the atomic scale, in order to avoid electrical shorting and ferromagnetic coupling through the pinholes. For applications involving tunneling magnetoresistive (TMR) heads, it is also desirable for the device resistance to be relatively low, in order to achieve a wide bandwidth and high frequency operation. The probability of electron tunneling through a tunnel barrier increases exponentially as the barrier is made thinner, however, for thicknesses less than 10 Å electrical shorting between the electrodes becomes increasingly problematic.

For example, a media-facing surface of MR sensors may be formed by lapping or polishing in a direction that traverses the tunnel barrier layer, which can cause dislodged electrode particles to bridge across a thin barrier. Similarly, conventional solid-state memory processing requires annealing at a relatively high temperature after formation of memory cells, which could in the case of MRAM devices cause diffusion of electrode materials into a tunnel barrier.

For a tunnel barrier material having a uniform specific resistance at each point, the overall resistance of the barrier layer is an exponential function of the thickness of the layer and inversely proportional to the area of the layer. For MR heads the area of the tunnel barrier layer is constrained, however, by the desired resolution of the head. Similarly, for MRAM applications the area of the tunnel barrier layer is constrained by the desired density of the memory cells.

The resistance and area product (RA product) is a figure of merit for SDT films, and is sensitively dependent upon the barrier thickness. Given the constraints upon the area of the devices, tunnel barrier layers may be as thin as several atomic layers. Another figure of merit for a SDT device is the magnetoresistance, which is the change in resistance divided by the resistance ($\Delta R/R$) of the device in response to a change in applied magnetic field. Since the noise of the device is related to the resistance, the magnetoresistance is also a measure of the signal to noise ratio (SNR) of the device.

SUMMARY

In accordance with an embodiment of the present disclosure, a tunneling barrier for a spin dependent tunneling (SDT) device includes a ferromagnetic element dispersed substantially throughout the barrier in a minority concentration. The use of such a tunneling barrier has been found to increase the magnetoresistance, also known as the $\Delta R/R$ response to an applied magnetic field, improving the signal and the signal to noise ratio. Such an increased $\Delta R/R$ response also offers the possibility of decreasing an area of the tunnel barrier layer. Decreasing the area of the tunnel barrier layer can afford improvements in resolution of devices such as MR sensors and increased density of devices such as of MRAM cells.

DETAILED DESCRIPTION OF THE PREFERRED EMBODIMENTS

Figure 1:
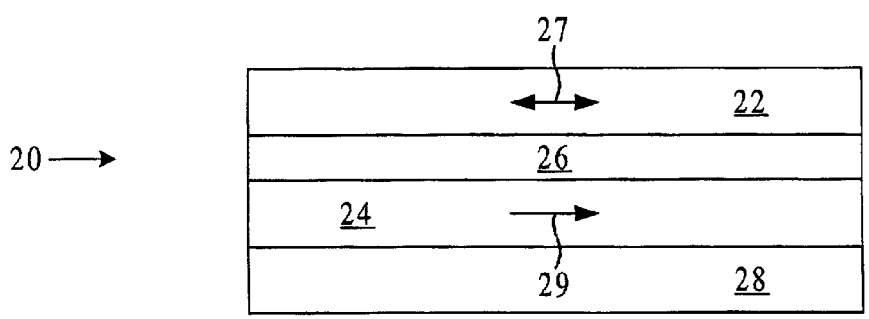
FIG. 1 is a cross-section of a SDT device having a plurality of magnetic particles disposed in a tunnel barrier layer that separates ferromagnetic layers having easy axes of magnetization substantially parallel to each other.

FIG. 1 shows a cross-section of a SDT device 20 including a tunnel barrier layer 26. A FM element is dispersed substantially throughout the tunnel barrier layer 26 in a minority concentration. The device includes a first ferromagnetic (FM) layer 22 and second FM layer 24 separated by the tunnel barrier layer 26. A pinning structure 28 stabilizes a magnetic moment of the second FM layer 24. In response to an applied magnetic field, the magnetic moment of the first FM layer 22 changes direction, as shown by arrow 27, while the magnetic moment of the second FM layer 24 is pinned, as shown by arrow 29. In this embodiment, which may for example be used in a MRAM device, an easy axis of magnetization of the first FM layer may be substantially parallel to that of the second FM layer 24, so that the first FM layer switches between substantially parallel and substantially antiparallel states. As long as the easy axes of magnetization of the first and second FM layers are more parallel than perpendicular, switching between two states is facilitated.

The pinning structure 28 may be an antiferromagnetic (AFM) layer that adjoins the pinned layer. The magnetic stabilization of the pinned layer may also be accomplished with a synthetic AFM structure involving a pair of FM layers exchange coupled across a thin transition metal layer. For example ruthenium (Ru) can be used in a sandwich of FM/Ru/FM in which the Ru layer has a thickness of about 8 Å. The magnetization direction of the pinned FM layer may be set upon deposition and annealing in a magnetic field.

Either or both of the first and second FM layers can be made primarily or entirely of metals such as iron (Fe), cobalt (Co), nickel (Ni) or alloys of such metals. Either or both of the first and second FM layers may also be made of half-metallic magnets such as $CrO_2$, $Fe_3O_4$, PtMnSb, NiMnSb, $Co_2MnSi$ or $Sr_2FeMoO_6$. Either or both of the first and second FM layers may also be made of plural layers of metals or half-metallic magnets.

Figure 2:
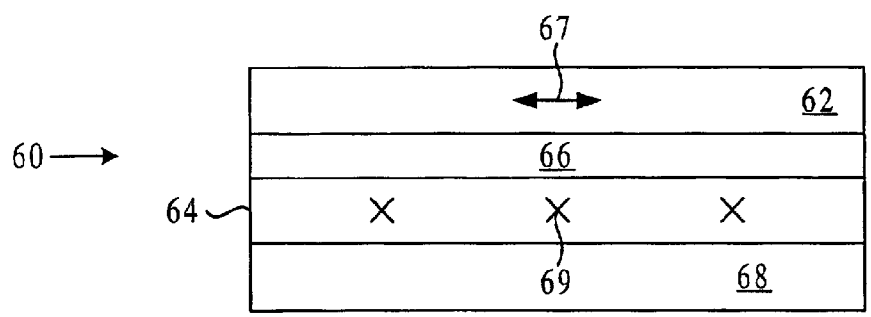
FIG. 2 is a cross-section of a SDT device having a plurality of magnetic particles disposed in a tunnel barrier layer that separates ferromagnetic layers having easy axes of magnetization substantially perpendicular to each other.

FIG. 2 shows a cross-section of a SDT device 60 having a minority concentration of magnetic elements dispersed substantially uniformly throughout a tunnel barrier layer 66. The device 60 includes a first ferromagnetic (FM) layer 62 and second FM layer 64 separated by the tunnel barrier layer 66. A pinning structure 68 constrains the direction of magnetization of the second FM layer 64. In response to an applied magnetic field, the magnetic moment of the first FM layer 62 changes direction, as shown by arrow 67, while the magnetic moment of the second FM layer 64 is pinned, as shown by cross marks, indicating a magnetic moment directed away from the viewer. In this embodiment, which may for example be used in a magnetic field sensing device, an easy axis of magnetization of the first FM layer may be substantially perpendicular to that of the second FM layer 64, so that the second FM layer switches between low resistance and high resistance states. As long as the easy axes of magnetization of the first and second FM layers are more perpendicular than parallel, a substantially linear change in resistance is facilitated.

A tunnel barrier layer such as layer 26 or layer 66 can be made primarily of dielectric materials with a minor concentration of magnetic elements such as Co or Fe, for example. The magnetic moment of the magnetic elements is not fixed. One way to have magnetic elements contained in a tunnel barrier layer is disclosed in the U.S. Patent Application entitled "Spin Dependent Tunnel Barriers Containing Magnetic Particles," invented by the same inventors and filed on the same day as the present application, and incorporated by reference herein.

Another way to incorporate magnetic elements in a tunnel barrier layer is to oxidize or nitridize an alloy containing a minority concentration of a magnetic element and a majority concentration of an element used to form a dielectric tunnel barrier. Since aluminum and silicon oxides and nitrides are compounds that can form a tunnel barrier with a high $\Delta R/R$ response, this discussion focuses on those compounds, although the technique may be applied to other tunnel barrier compounds as well, such as oxides of magnesium, tantalum or hafnium. It is preferable that such alloys have a stable solid phase at elevated temperatures for forming a stable precursor layer that will be oxidized or nitridized to form the barrier layer. It is also desirable that such alloys have a stable solid phase to provide a stable target material that is used to deposit the precursor layer.

Figure 3:
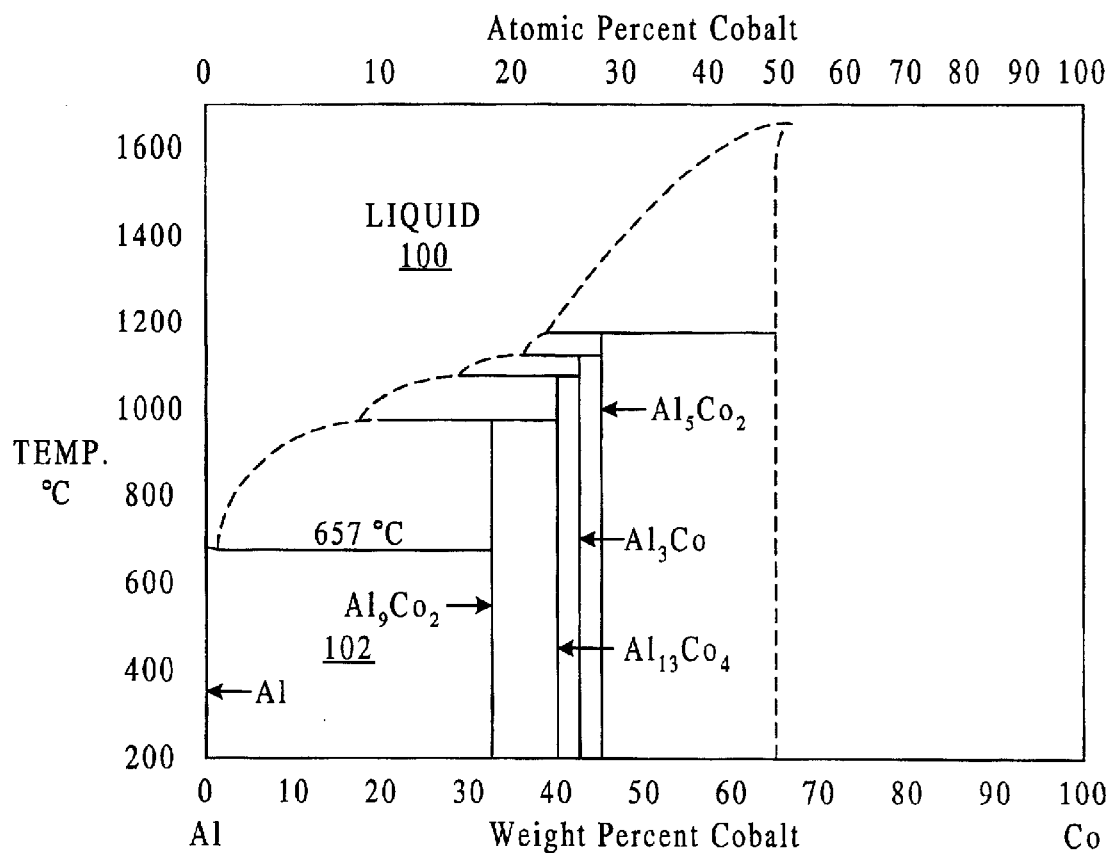
FIG. 3 is a part of a binary phase diagram of AL—Co.

FIG. 3 shows an aluminum-rich part of an Al—Co binary alloy phase diagram. The phase diagram represents the alloy behavior at thermodynamic equilibrium. The upper left portion of the diagram corresponds to a liquid 100 phase, while the vertical lines labeled $Al_9CO_2$, $Al_{13}Co_4$, $Al_3CO$, and $Al_5CO_2$ each represent a single solid phase compound of Al and Co. A region 102 between Al and $Al_9CO_2$ and below 657° C. corresponds to a solid alloy of Al and $Al_9CO_2$, with the concentration of Al and Co varying in accordance with the relative amounts of Al and $Al_9CO_2$. A solid sputtering target can be made containing 2% Co and 98% Al, for example, by cooling a liquid containing appropriate amounts of those elements.

The target can be composed of Al and $Al_9CO_2$ because we can assume that thermodynamic equilibrium is obtained in a traditional melting/solidification process. Alternatively, rapid quenching may be employed to obtain a desired concentration of a sputtering target. The target will remain solid through sputtering despite temperatures that may reach nearly 600° C., and a solid barrier layer alloy can be deposited. The deposited films are the result of a non-equilibrium condensation process, so various non-equilibrium compositions can be achieved in the films. The alloy film is then oxidized or nitridized. In this manner cobalt can be dispersed throughout a tunnel barrier layer in atomic concentrations ranging from about ten percent to less than one tenth of one percent.

Figure 4:
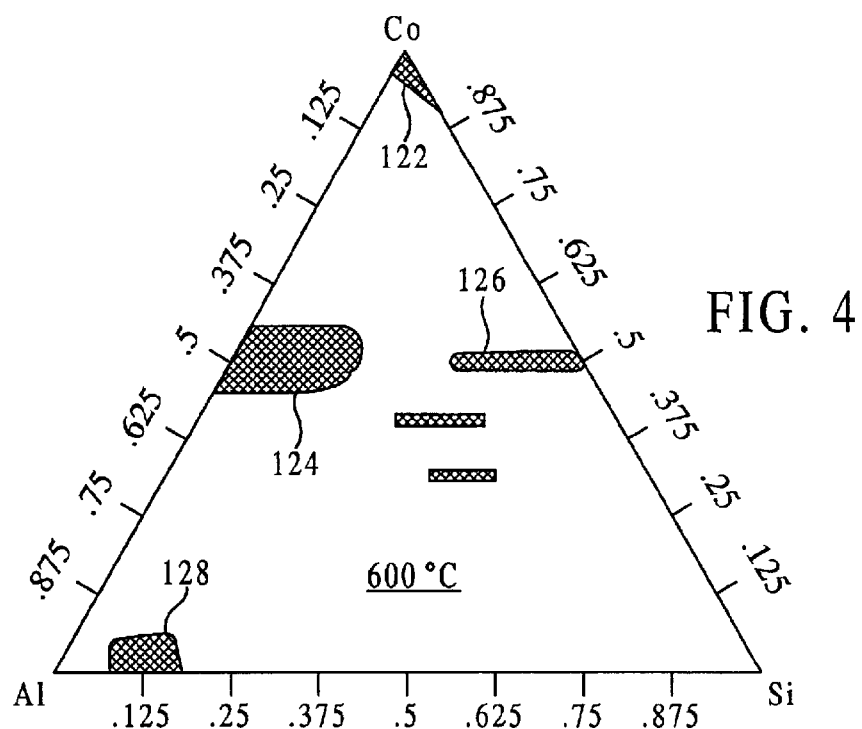
FIG. 4 is a simplified ternary phase diagram of AL—Co—Si alloys at 600° C.

It may be desired in some embodiments to deposit a single phase alloy of Al and Co that contains an atomic concentration of Co less than that found in $Al_9CO_2$. FIG. 4 is a simplified ternary phase diagram of Al—Co—Si alloys at 600° C., adapted from the Handbook of Ternary Alloy Phase Diagrams, ASM International, (1995), page 3608. Each of the three axes lists the atomic concentration of the pair of elements shown at the end of each axis, while the area within the diagram illustrates various atomic concentrations of materials composed of all three elements. Several cross-hatched areas on the phase diagram represent atomic concentrations for which stable ternary phases exist. That is, although the relative concentrations of the elements vary within each crosshatched area, a solid alloy having a concentration falling within one of these areas has a uniform composition that is not segregated into grains having different concentrations of elements.

For example, area 122 represents a stable phase corresponding to substantially pure Co with trace amounts of Si and/or Al. Similarly, areas 124 and 126 represent stable phases corresponding to AlCo and CoSi, respectively, with minority concentrations of the third element, Si or Al, respectively. Area 128 represents a stable phase corresponding to a mostly Al alloy having an atomic concentration of Si in a range between about 8% and 16%, and a minority an atomic concentration of Co in a range between zero and about 8%. The alloy corresponding to area 128 is believed to contain a substantially homogenous mixture of $Al_9CO_2$ and AlSi. One interpretation of area 128 is that the addition of about 10% Si to a concentration of Al and Co represented by region 102 of FIG. 3 both increases the solubility of Co in Al and leads to the single phase represented by area 128. An alloy corresponding to area 128 can form a stable and compositionally uniform target for sputtering deposition. A sputtered or other low pressure deposited layer of this alloy can be oxidized or nitridized to form a tunnel barrier layer such as layer 26 or layer 66.

This solid single phase alloy of aluminum, cobalt and silicon may be expressed as approximately $(Co_xAl_{1-x})_{1-y}Si_y$, where $0\% < x \leq 8\%$ and where $8\% < y \leq 16\%$. After oxidation of this alloy a material may be formed that is substantially similar to alumina ($Al_2O_3$), but which also contains a substantially uniformly distributed amount of oxidized cobalt. This material may have five percent or less atomic concentration of cobalt, and yet have a significantly higher ΔR/R response when employed as tunnel barrier than pure alumina that is similarly employed. Instead of or in addition to oxidation, nitridation may be applied to a stable AlCoSi alloy to produce a material that may be substantially similar to aluminum nitride (AlN), but which also contains a small amount of substantially uniformly distributed nitridized cobalt.

Figure 5:
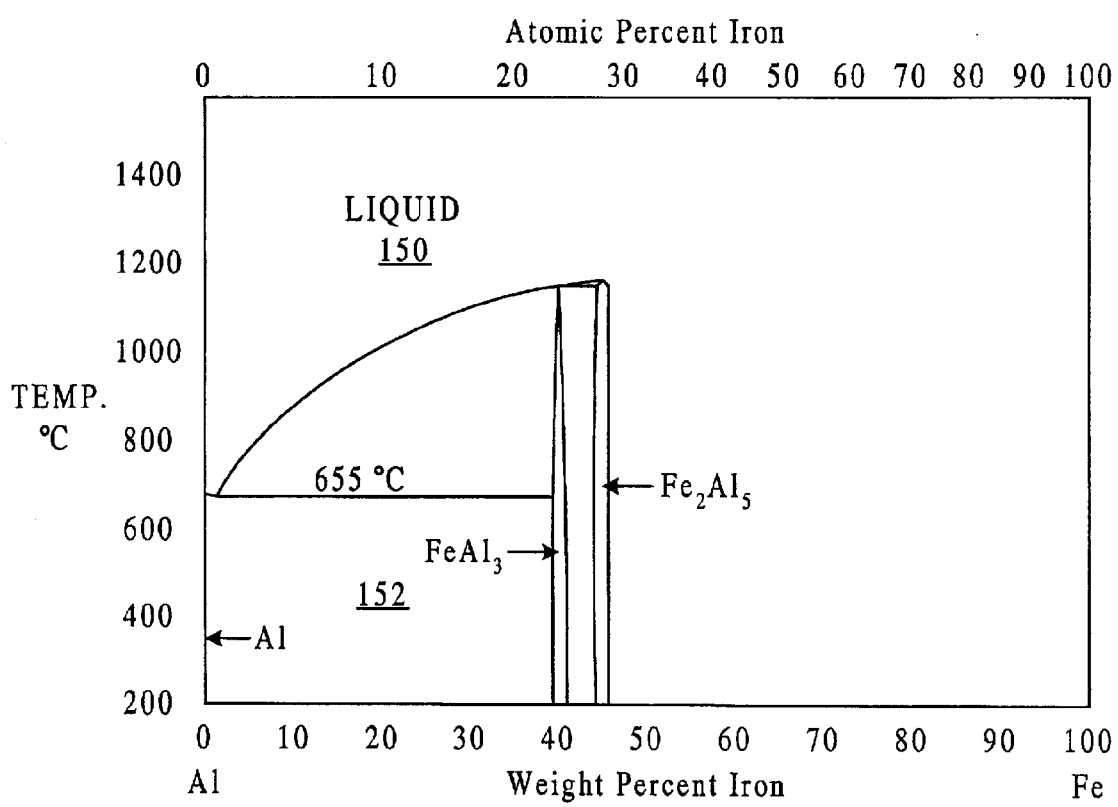
FIG. 5 is a part of a binary phase diagram of AL—Fe.

FIG. 5 shows an aluminum-rich part of an aluminum-iron binary alloy phase diagram. The upper left portion of the diagram corresponds to a liquid 150 phase, while the substantially vertical sections labeled $FeAl_3$ and $Fe_2Al_5$ each represent a single solid phase compound of Al and Fe. A region 152 between $FeAl_9$ and $Fe_2Al_5$ and below 655° C. corresponds to a solid alloy of Al and $FeAl_3$, with the concentration of Al and Fe varying in accordance with the relative amounts of Al and $FeAl_3$. A solid single phase sputtering target can be made containing up to about 4.4 atomic percent Fe with the remainder Al, for example, by rapid quenching a liquid containing appropriate concentrations of those elements. The target will remain solid through sputtering despite temperatures that may reach nearly 600° C., and a solid barrier layer alloy can be deposited that is then oxidized or nitridized. In this manner iron can be dispersed throughout a tunnel barrier alloy layer in atomic concentrations ranging from about four percent to less than one tenth of one percent.

After oxidation of this alloy a material may be formed that is substantially similar to alumina ($Al_2O_3$), but which also contains a substantially uniformly distributed amount of oxidized iron. This material may have two percent or less atomic concentration of iron, and yet have a significantly higher ΔR/R response when employed as tunnel barrier than pure alumina that is similarly employed. The material may be amorphous or crystalline, and can be described by the formula $(Al_xFe_{1-x})_yO_{1-y}$, where $95.6\% \leq x < 100\%$. Instead of or in addition to oxidation, nitridation may be applied to a stable AlFe alloy to produce a material that may be substantially similar to aluminum nitride (AlN), but which also contains a small amount of substantially uniformly distributed nitridized iron. It is also possible to form an alloy containing mostly aluminum and a minor concentration of silicon as well as iron.

The thickness of a tunnel barrier layer, such as layer 26 or layer 66, can vary significantly for different embodiments, for example in a range between about 4 Å and about 20 Å. The increased ΔR/R response provided in accordance with the present invention allows the spin dependent tunneling device to have a reduced area. The tunnel barrier layer 26 or 66 may itself be composed of plural dielectric layers with an oxidized or nitridized magnetic alloy disposed in at least one of the dielectric layers. As mentioned above, other materials can be used to form primarily dielectric layers having a minority concentration of FM elements dispersed substantially uniformly through each of the layers, and an overall tunnel barrier layer 26 can be formed from various combinations of such layers.

Figure 6:
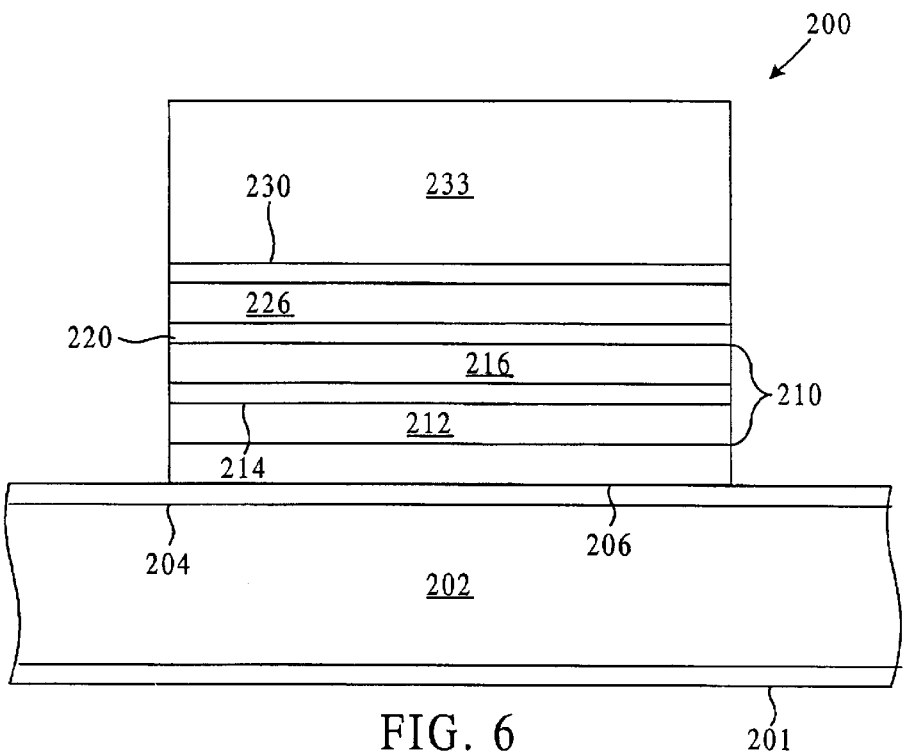
FIG. 6 is a cutaway cross-sectional view of a of a SDT sensor.

FIG. 6 shows a cross-section of a portion of a SDT sensor 200 in accordance with one embodiment of the invention, such as may be employed in an information storage and retrieval device. Formation of SDT sensor 200 may occur on a wafer substrate such as AlTiC, SiC or Si, not shown, upon which a seed layer 201 of Ta has been deposited. A first or bottom lead 202 of electrically conductive material such as Cu or Au has been formed, and capped with another Ta seed layer 204. An electrically conductive layer 206 of AFM material was then formed on the seed layer 204. The AFM material may, for example, include IrMn, FeMn, NiMn, PdPtMn, NiFeCr/PtMn or NiFe/PtMn. A magnetically pinned structure 210 can then be formed of a sandwich of FM layers 212 and 216 that surround a very thin coupling layer 214 of Ru or similar elements. The FM layers 212 and 216, which may for example be formed of CoFe, are magnetically coupled with moments directed in opposite directions about coupling layer 214, with the moment of FM layer 212 additionally pinned by AFM layer 206. A single pinned layer may be alternatively employed instead of the three layer antiferromagnetically pinned structure 210.

A tunneling barrier film 220 that may be between a few atomic layers and several or more nanometers in thickness, depending upon the desired application, is then formed on the FM layer 216. The tunneling barrier film 220 may be formed by first depositing on the FM layer 216 an alloy containing a minority concentration of one or more FM elements, and then oxidizing or nitridizing the alloy layer. More than one such primarily dielectric layer may be used to form the tunneling barrier film 220, at least one of the layers having a minority concentration of one or more FM elements.

The thickness of the tunneling barrier film 220 for a SDT head implementation may be between 5 Å and 5 nm. The atomic concentration of magnetic particles in a tunnel barrier layer can be measured by various means, such as x-ray photoelectron spectroscopy (XPS), auger electron spectroscopy (AES), transmission electron microscopy (TEM), electron energy loss spectroscopy (EELS), parallel electron energy loss spectroscopy (PEELS), secondary ion mass spectroscopy (SIMS) or x-ray fluorescence (XRF).

After the tunneling barrier has been made, a free FM layer 226 is formed of materials such as CoFe, NiFe, CoNiFe, or multilayers of these materials. A capping layer 230 of Ta, Ru, Cr or NiFeCr may be used to prevent the oxidation of the free layer 226. Edges of the SDT device are then defined, for example by ion beam milling into a desirable structure, and a top lead 233 is formed, e.g., of Au or Cu. For an embodiment to be used as a magnetic field sensor, for example in a read-write head, a hard bias material may be formed adjacent to edges of the free layer 226 to reduce Barkhausen noise. A similar technique can be applied to form a top SDT structure, i.e., by creating a pinned layer or layers after a SDT barrier, which is formed atop a free layer. Other variations of the sensor stack structure are also possible that include plural magnetic particles in a tunnel barrier region. For instance, some portions of a pinned or free layer may be intentionally oxidized or nitridized to form a nanooxide or nanonitride that can enhance the sensitivity.

Figure 7:
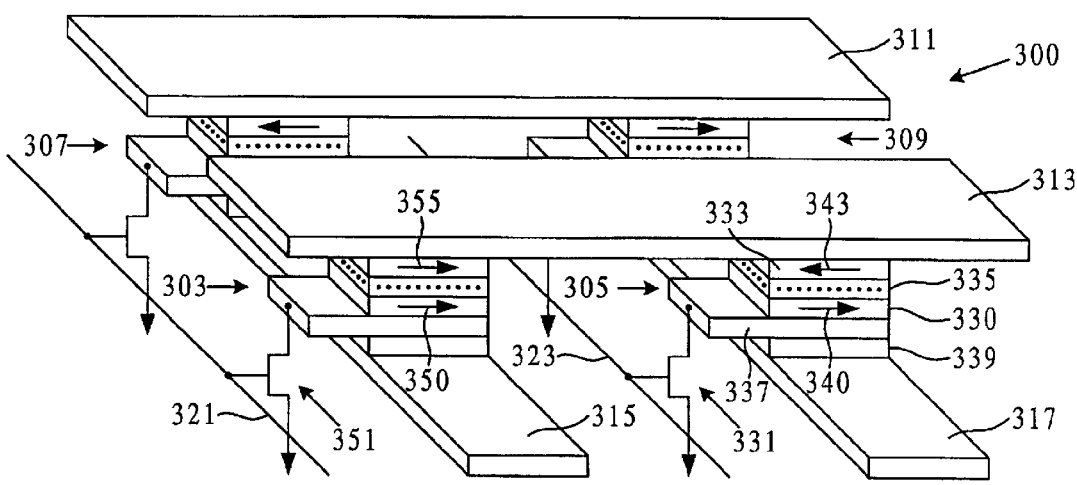
FIG. 7 is a schematic perspective view of plural SDT devices used as part of a solid-state memory such as an MRAM device.

FIG. 7 shows one embodiment using the SDT devices as part of a solid-state memory such as an MRAM device 300.

In this example, four memory bits or cells 303, 305, 307 and 309 are shown as stacks of layers between conductive lines arranged to write and read data to and from each cell. Lines 311 and 313, which may be called bit lines, are used for both reading and writing and are in electrical as well as magnetic communication with the cells. Lines 315 and 317, which may be called digit lines, are used only for writing, and are in magnetic communication with but electrically isolated from the cells. Word lines 321 and 323 are in electrical communication with the cells via transistors, and are used only for reading.

Each of the cells 303, 305, 307 and 309 includes a pinned FM layer, a free FM layer and a tunnel barrier layer containing magnetic particles. Focusing on cell 305 provides an example for the operation of various cells. Cell 305 has a pinned structure or layer 330, a free layer 333 and a tunnel barrier layer 335 containing magnetic particles. A transistor 331 controlled by word line 323 is coupled to a conductive lead 337 adjoining the pinned structure 330. The conductive lead 337 is electrically isolated from digit line 317 by insulation layer 339.

Pinned layer 330 has a magnetic moment indicated by arrow 340, and free layer 333 has a magnetic moment indicated by arrow 343. A magnetic state is written to cell 305 by flowing current through lines 313 and 317 in an amount sufficient to switch the magnetic moment of the free layer 333. Current in line 313 creates a magnetic field along a hard axis of free layer 333 and current in line 317 creates a magnetic field along an easy axis of free layer 333, the combined fields being sufficient to switch the magnetic moment of the cell, whereas either field alone is insufficient to switch the cell. Arrow 343 is antiparallel to arrow 340, indicating that free layer 333 has a magnetic moment antiparallel to that of pinned layer 330. Turning on transistor 331 to sense the state of cell 305 would result in a high voltage state (when a constant current is applied) through the transistor, which may indicate for instance that a value of zero has been stored in cell 305.

Cell 303, on the other hand, has a free layer with a magnetic moment parallel to that of its pinned layer, as indicated by arrows 350 and 355. Turning on transistor 351 to sense the state of cell 305 would result in a low voltage state (when a constant current is applied) through the transistor, which may indicate for instance that a value of one has been stored in cell 305. It may also be possible for such SDT devices to have more than two distinct states or levels of resistance, allowing more information to be stored in each cell or MRAM module.

Figure 8:
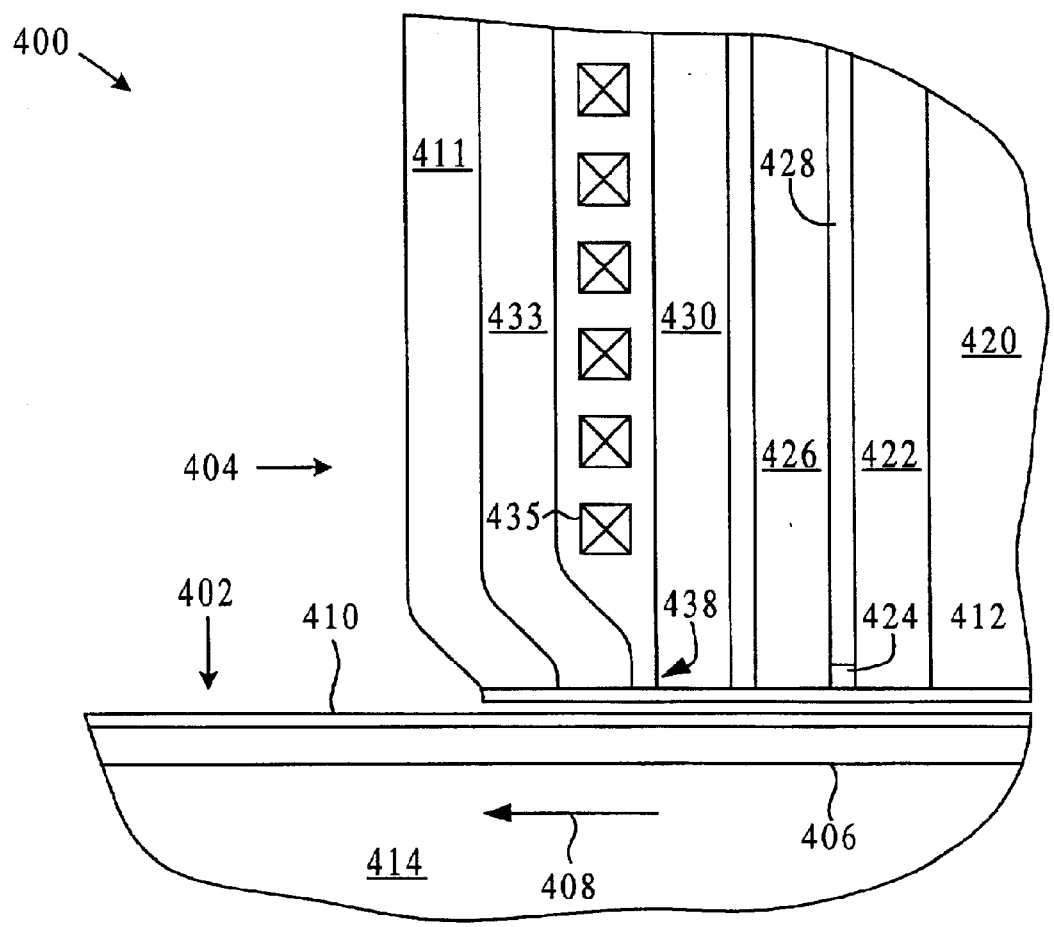
FIG. 8 is a cutaway cross-sectional view of an SDT device used in an information storage system such as a hard disk drive.

FIG. 8 shows one embodiment using an SDT device as part of an information storage system such as a hard disk drive 400. A rigid disk 402 spins rapidly in a direction shown by arrow 408 relative to a head 404 containing a transducer for reading and writing magnetic patterns on a media layer 406 of the disk. A hard coating layer 410 forms a surface of the disk 402 protecting the media layer 406 from the head 404, and a similar hard coating 412 forms a surface of the head 404 to protect the transducer from the disk, while another hard coating 411 forms a trailing end of the head. The disk includes a substrate 414 upon which the media layer 406 may be formed, and the disk may include additional layers, not shown. The head also includes a substrate 420 upon which the transducer has been formed, and may include additional layers, not shown.

A first shield 422 has been formed over the substrate, the shield including ferromagnetic material for shielding a SDT sensor 424 from magnetic signals that are not directly opposite the sensor 424 in the media layer 406, as well as conductive material for providing electrical current to the sensor 424. A second shield 426 is separated from the first shield 422 by a dielectric layer 428, the shields connected by the sensor 424. The second shield 426 also includes ferromagnetic material for shielding the sensor 424 from magnetic signals that are not directly opposite the sensor 424 in the media layer 406, as well as conductive material for providing electrical current to the sensor 424. As the media layer 406 travels past the sensor 424 in the direction of arrow 408, the sensor reads magnetic signals from the media layer.

First and second ferromagnetic yoke layer 430 and 433 are magnetically coupled together in a loop that is inductively driven by current in coil winding sections 435. The magnetic loop is broken by a nonferromagnetic gap 438, so that some magnetic flux propagating around the loop is diverted to the media layer 406 of the disk 402, writing a magnetic signal to the media layer. This magnetic signal can later be read by the MR sensor, which may have an increased resolution due to subnanometer magnetic particles contained in a tunnel barrier layer.

Although the above description has focused on illustrating SDT devices for use with information storage systems and solid-state memory, other devices can be formed in accordance with the present invention. Moreover, other embodiments and modifications of this invention will be apparent to persons of ordinary skill in the art in view of these teachings. Therefore, this invention is limited only by the following claims, which include all such embodiments and modifications when viewed in conjunction with the above specification and accompanying drawings.

What is claimed is:

1. A device comprising:
   a first electrode having a magnetic moment with a direction that is substantially fixed in response to an applied magnetic field;
   a second electrode having a magnetic moment with a direction that is variable in response to said applied magnetic field; and
   a tunnel barrier layer separating said first and second electrodes, said tunnel barrier layer including a substantially homogenous, primarily dielectric material including a ferromagnetic element in an atomic concentration of less than five percent.

2. The device of claim 1, wherein said device is a part of an electromagnetic transducer.

3. The device of claim 1, wherein said device is a part of a solid-state memory.

4. The device of claim 1, wherein said tunnel barrier layer includes atoms of aluminum, cobalt and silicon.

5. The device of claim 1, wherein said tunnel barrier layer includes atoms of aluminum and iron.

6. The device of claim 1, wherein said tunnel barrier layer includes atoms of aluminum, iron and silicon.

7. The device of claim 1, wherein said tunnel barrier layer includes an oxidized alloy of aluminum.

8. The device of claim 1, wherein said tunnel barrier layer includes a nitridized alloy of aluminum.

9. The device of claim 1, wherein said tunnel barrier layer includes a nitridized alloy of aluminum, and said alloy is a single phase solid at 600° C.

10. The device of claim 1, wherein said second electrode has an easy axis of magnetization that is substantially parallel to said magnetic moment direction of said first electrode.

11. The device of claim 1, wherein said second electrode has an easy axis of magnetization that is substantially perpendicular to said magnetic moment direction of said first electrode.

12. The device of claim 1, wherein at least one of said first and second electrodes includes a half-metallic magnet.

13. The device of claim 1, wherein said tunnel barrier layer includes a half-metallic magnet.

14. A device comprising:
   a first ferromagnetic layer having a magnetic moment with a direction that is substantially fixed in response to an applied magnetic field;
   a second ferromagnetic layer having a magnetic moment with a direction that is variable in response to said applied magnetic field; and
   a dielectric layer separating said first and second ferromagnetic layers and having a thickness of less than three nanometers, said dielectric layer including a ferromagnetic element substantially uniformly dispersed in said dielectric layer at an atomic concentration of less than about five percent.

15. The device of claim 14, wherein said device is a part of an electromagnetic transducer.

16. The device of claim 14, wherein said device is a part of a solid-state memory.

17. The device of claim 14, wherein said second ferromagnetic layer has an easy axis of magnetization that is substantially parallel to said magnetic moment direction of said first ferromagnetic layer.

18. The device of claim 14, wherein said second ferromagnetic layer has an easy axis of magnetization that is substantially perpendicular to said magnetic moment direction of said first ferromagnetic layer.

19. The device of claim 14, wherein said dielectric layer includes atoms of aluminum and iron.

20. The device of claim 14, wherein said dielectric layer includes atoms of aluminum, cobalt and silicon.

21. The device of claim 14, wherein said dielectric layer includes atoms of aluminum, iron and silicon.

22. The device of claim 14, wherein said dielectric layer includes an oxidized alloy of aluminum.

23. The device of claim 14, wherein said dielectric layer includes a nitridized alloy of aluminum.

24. The device of claim 14, wherein said dielectric layer includes a nitridized alloy of aluminum, and said alloy is a single phase solid at 600° C.

25. The device of claim 14, wherein at least one of said first and second ferromagnetic layers includes a half-metallic magnet.

26. A device comprising:
   a first electrode including a first magnetic layer having a magnetic moment with a direction that is substantially fixed in response to an applied magnetic field;
   a second electrode including a second magnetic layer having a magnetic moment with a direction that is variable in response to said applied magnetic field; and
   a dielectric layer separating said first and second magnetic layers, having a thickness of less than five nanometers and containing a magnetic element substantially uniformly dispersed in an atomic concentration of less than about five percent;
   wherein an electrical current between said electrodes depends upon an orientation of said second magnetic moment relative to that of said first magnetic moment.

27. The device of claim 26, wherein said device is a part of an electromagnetic transducer.

28. The device of claim 26, wherein said device is a part of a solid-state memory.

29. The device of claim 26, wherein said second ferromagnetic layer has an easy axis of magnetization that is substantially parallel to said magnetic moment direction of said first ferromagnetic layer.

30. The device of claim 26, wherein said second ferromagnetic layer has an easy axis of magnetization that is substantially perpendicular to said magnetic moment direction of said first ferromagnetic layer.

31. The device of claim 26, wherein said dielectric layer includes atoms of aluminum and iron.

32. The device of claim 26, wherein said dielectric layer includes atoms of aluminum, cobalt and silicon.

33. The device of claim 26, wherein said dielectric layer includes atoms of aluminum, iron and silicon.

34. The device of claim 26, wherein said dielectric layer includes an oxidized alloy of aluminum.

35. The device of claim 26, wherein said dielectric layer includes a nitridized alloy of aluminum.

36. The device of claim 26, wherein said dielectric layer includes an nitridized alloy of aluminum, and said alloy is a single phase solid at 600° C.

37. The device of claim 26, wherein at least one of said first and second ferromagnetic layers includes a half-metallic magnet.

* * * * *